(12) United States Patent
Weaver et al.

(10) Patent No.: US 10,211,622 B2
(45) Date of Patent: Feb. 19, 2019

(54) SYSTEM AND METHOD FOR FAULT INTERRUPTION WITH MEMS SWITCHES

(71) Applicant: General Electric Company, Schenectady, NY (US)

(72) Inventors: Stanton Earl Weaver, Broadalbin, NY (US); Richard St-Pierre, Clifton Park, NY (US); Glenn Scott Claydon, Wynantskill, NY (US)

(73) Assignee: General Electric Company, Schenectady, NY (US)

( * ) Notice: Subject to any disclaimer, the term of this patent is extended or adjusted under 35 U.S.C. 154(b) by 253 days.

(21) Appl. No.: 15/197,221

(22) Filed: Jun. 29, 2016

(65) Prior Publication Data

US 2018/0006445 A1 Jan. 4, 2018

(51) Int. Cl.

| | |
|---|---|
| *H02H 3/20* | (2006.01) |
| *H02H 3/24* | (2006.01) |
| *H02H 3/38* | (2006.01) |
| *G01R 31/02* | (2006.01) |
| *H01H 47/00* | (2006.01) |
| *H01H 59/00* | (2006.01) |
| *H02H 3/46* | (2006.01) |

(Continued)

(52) U.S. Cl.
CPC ............... *H02H 3/38* (2013.01); *G01R 31/02* (2013.01); *H01H 47/002* (2013.01); *H01H 59/0009* (2013.01); *H02H 3/05* (2013.01); *H02H 3/46* (2013.01); *H02H 7/26* (2013.01)

(58) Field of Classification Search
CPC ............... H02H 3/38; H02H 3/05; H02H 3/46

USPC .......................................................... 361/90
See application file for complete search history.

(56) References Cited

U.S. PATENT DOCUMENTS

| | | | |
|---|---|---|---|
| 6,738,246 B1 | 5/2004 | Strumpler | |
| 7,864,491 B1 * | 1/2011 | Bauder | H01H 9/30 361/13 |
| 7,903,382 B2 | 3/2011 | Premerlani et al. | |

(Continued)

OTHER PUBLICATIONS

Li et al., "Power Switch System Based on Microelectromechanical Switch", 2011 16th International Solid-State Sensors, Actuators and Microsystems Conference, pp. 675-678, Jun. 5-9, 2011, Beijing.

(Continued)

*Primary Examiner* — Thienvu V Tran
*Assistant Examiner* — Lucy M Thomas
(74) *Attorney, Agent, or Firm* — Ziolkowski Patent Solutions Group, SC; Jean K. Testa

(57) ABSTRACT

An electrical system includes an operation MEMS switch operable in on and off states to enable and disable current flow to a load and a fault interruption MEMS switch positioned in series with the operation MEMS switch. The fault interruption MEMS switch is operable in on and off states to enable and disable current flow to the electrical load, with operation of the fault interruption MEMS switch in the off state disabling current flow to the load regardless of the state of the operation MEMS switch. A fault sensor control system operate to sense a system variable, analyze the system variable to detect if a fault is affecting the electrical system and, upon detection of a fault, switch the fault interruption MEMS switch from the on state to the off state to interrupt current flowing through the operation MEMS switch to the load.

21 Claims, 4 Drawing Sheets

(51) Int. Cl.
*H02H 3/05* (2006.01)
*H02H 7/26* (2006.01)

(56) References Cited

U.S. PATENT DOCUMENTS

| | | |
|---|---|---|
| 8,050,000 B2 | 11/2011 | Wright et al. |
| 8,144,445 B2 | 3/2012 | Caggiano et al. |
| 8,358,488 B2 | 1/2013 | Premerlani et al. |
| 8,537,507 B2 | 9/2013 | Anand et al. |
| 8,687,325 B2 | 4/2014 | Premerlani et al. |
| 9,076,607 B2 | 7/2015 | Premerlani et al. |
| 2008/0164961 A1* | 7/2008 | Premerlani .......... H01H 1/0036 335/7 |
| 2008/0310056 A1 | 12/2008 | Kumfer et al. |
| 2008/0310058 A1 | 12/2008 | Premerlani et al. |
| 2008/0310062 A1 | 12/2008 | Kumfer et al. |
| 2011/0140546 A1* | 6/2011 | Gowda ................ H01H 1/0036 307/139 |

OTHER PUBLICATIONS

International Search Report and Written Opinion issued in connection with corresponding PCT Application No. PCT/US2017/039537 dated Oct. 10, 2017.

\* cited by examiner

US 10,211,622 B2

SYSTEM AND METHOD FOR FAULT INTERRUPTION WITH MEMS SWITCHES

BACKGROUND OF THE INVENTION

Embodiments of the invention relate generally to a Micro-Electro-Mechanical Systems (MEMS) switch and, more particularly, to a system and method for fault interruption using MEMS switches.

MEMS is a technology that in its most general form can be defined as miniaturized mechanical and electro-mechanical elements (i.e., devices and structures) that are made using the techniques of microfabrication. The critical physical dimensions of MEMS devices can vary from well below one micron on the lower end of the dimensional spectrum, all the way to several millimeters. Likewise, the types of MEMS devices can vary from relatively simple structures having no moving elements, to extremely complex electro-mechanical systems with multiple moving elements under the control of integrated microelectronics, with free-standing MEMS structures or "beams" often acting as relays, for example.

With respect to MEMS devices having moving elements, such a moving element may be in the form of a free-standing and suspended MEMS structure that is configured as a cantilever with a first end anchored to a substrate (e.g., fused silica, glass, silicon substrates) and a second free end having a contact. When the MEMS device is activated, the free-standing MEMS structure moves its contact against a substrate contact on the device substrate and under the MEMS structure contact.

With specific regard to MEMS switches, it is further recognized that—in operation—the contacting of the free-standing structure with the substrate contact can cause the free-standing structure (i.e., a contact of the free-standing structure) to experience mechanical wear due to repeated physical impact with the substrate contact, heating of the free-standing structure contact by joule heating, and electrical discharges between the free-standing structure contact and the substrate contact. This wearing of the free-standing structure contact can eventually lead to reliability issues in the MEMS switches.

One common reliability issue in MEMS switches resulting from the wearing of the free-standing structure contact is that the contact becomes stuck closed. Other conditions that can contribute to the stuck closed contact failure mode are arcing due to a hot switching condition, stiction due to van der Waals forces, plastic deformation of the beam, or gate driver failures when the MEMS switches are in the on condition. Depending on the system in which a MEMS switch is installed, the stuck closed fault condition can cause additional failures upstream or downstream of a stuck MEMS switch and can be especially problematic in applications that include a large number of MEMS switches.

It is recognized that the stuck closed failure mode in MEMS switches is not the only failure mode that can occur in electrical systems. Other failure modes include, for example, short circuits, open circuits, voltage transients or power surges or spikes, power failure, power sags, brownouts or undervoltage conditions, overvoltage conditions, electrical line noise, frequency variations, switching transients, harmonic distortion, and cooling system failures. As with the stuck closed failure mode in MEMS switches, any of the above-listed failures will cause damage to a system if it is not detected and managed properly.

Therefore, it is desirable to provide a fast acting and cost effective solution to interrupt circuits containing MEMS switches in electrical systems that are experiencing a failure.

BRIEF DESCRIPTION OF THE INVENTION

In accordance with one aspect of the invention, an electrical system having a fault interruption MEMS switch unit comprises a first operation MEMS switch positioned in a first electrical path, the first operation MEMS switch operable in an on state that enables current to flow to a first electrical load and an off state that disables current from flowing to the first electrical load. The electrical system also includes a first fault interruption MEMS switch positioned in series with the first operation MEMS switch, the first fault interruption MEMS switch operable in an on state that enables current to flow to the first electrical load and an off state that disables current from flowing to the first electrical load, wherein operation of the first fault interruption MEMS switch in the off state disables current from flowing to the first electrical load regardless of the state of the first operation MEMS switch. The electrical system further includes a first fault sensor positioned to sense a first system variable and a control system programmed to receive the first system variable from the first fault sensor, analyze the first system variable to detect if a fault is affecting the electrical system and, upon detection of a fault, switch the first fault interruption MEMS switch from the on state to the off state to interrupt current flowing through the first operation MEMS switch to the first electrical load.

In accordance with another aspect of the invention, a method of interrupting current in an electrical circuit upon detection of a fault condition includes receiving power at an input to the electrical circuit and closing a first fault isolation MEMS switch via a controller upon powering up the electrical circuit so as to allow current to flow from the input to a first circuit load, the first fault isolation MEMS switch positioned in a first current path. The method also includes selectively operating a first operation MEMS switch in series with the first fault isolation MEMS switch to provide current to the first circuit load through the first current path and interrupt current through the first current path, measuring, via a first fault sensor, a first characteristic affecting the electrical circuit, and providing the measured first characteristic to the controller. The method further includes monitoring, via the controller, the measured first characteristic to detect if a fault condition is present and opening, via the controller, the first fault isolation MEMS switch upon detecting that a fault condition is present so as to interrupt current flowing to the first electrical load and prevent damage to the electrical circuit.

In accordance with yet another aspect of the invention, a power system having MEMS switch failure protection includes a power source, a first system load that receives power from the power source, and a first process MEMS switch disposed between the power source and the first system load along a first circuit path, the first process MEMS switch operable in a closed position and an open position to selectively control a current flowing from the power source to the first system load. The power system also includes a failure isolation MEMS switch module having a first failure isolation MEMS switch positioned in series with the first process MEMS switch and operable in a closed position and an open position to selectively control a current flowing through the first process MEMS switch, a first failure sensor measuring a first system characteristic corresponding to the position of the first process MEMS switch, and a control unit programmed to receive the first system characteristic from the first failure sensor, determine, using the first system characteristic, if the first process MEMS switch is stuck in the closed position and, upon determining that the first process MEMS switch is stuck in the closed position, switch the first failure isolation MEMS switch from the closed position to the open position to electrically isolate the first system load from the power source.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Embodiments of the invention set forth herein relate to interrupting power or electrical circuits or systems during fault conditions or failure modes using MEMS switches. A fault or failure interruption or isolation MEMS switch module is provided that includes a fault or failure interruption or isolation MEMS switch for interrupting a power or electrical system or circuit during a fault to isolate a power source from an electrical load. A control system in the MEMS switch module closes the fault interruption MEMS switch upon system power-up or start-up and opens the fault interruption MEMS switch based on feedback from a fault or failure sensor measuring a characteristic or variable representative of whether a fault condition has occurred.

Figure 1:
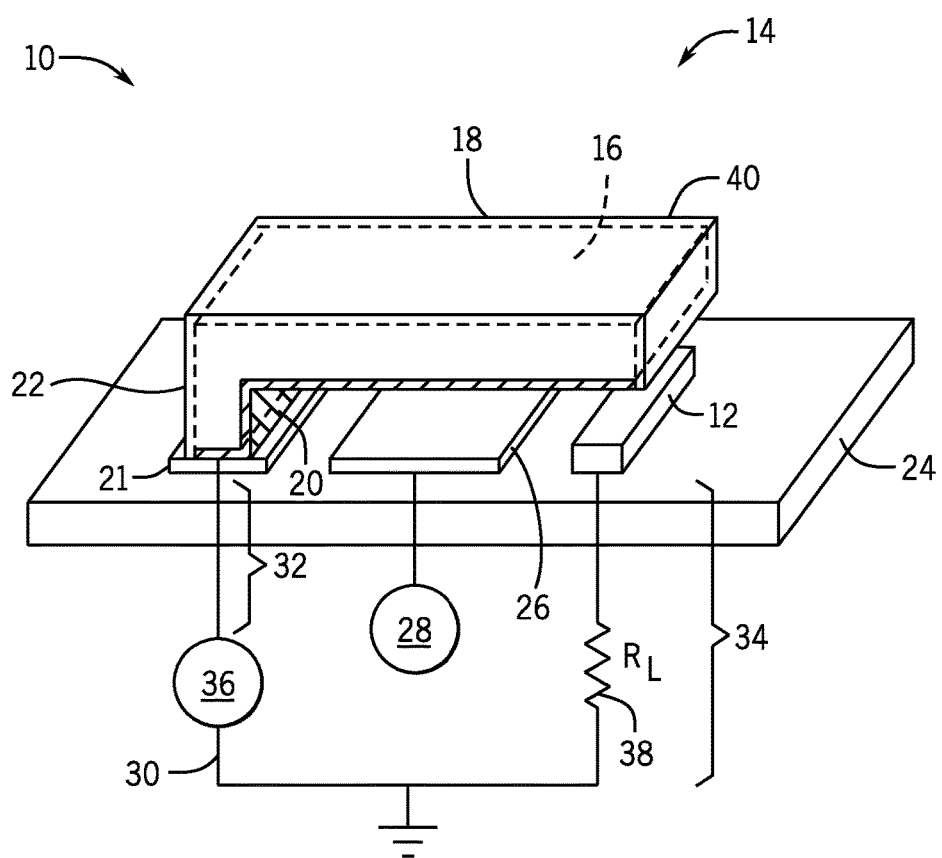
FIG. 1 is a schematic perspective view of a MEMS switch, according to an exemplary embodiment of the invention.
Figure 2:
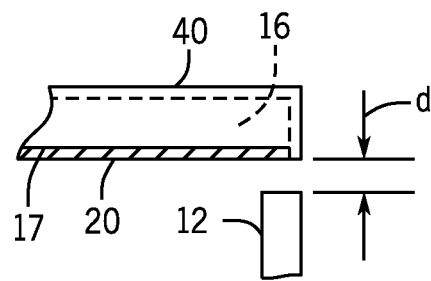
FIG. 2 is a schematic side view of the MEMS switch of FIG. 1 in an open position.
Figure 3:
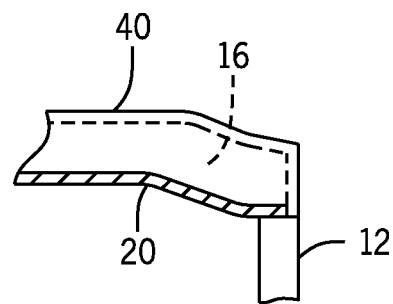
FIG. 3 is a schematic side view of the MEMS switch of FIG. 1 in a closed position.

Referring to FIGS. 1-3, schematic perspective views of an electrostatic micro-electro-mechanical system (MEMS) switch 10 are shown in accordance with an exemplary embodiment of the invention. According to the exemplary embodiment shown in FIGS. 1-3, the MEMS switch 10 includes a substrate contact 12, which comprises a conductive material (e.g., metal). MEMS switch 10 also includes a free-standing and suspended mechanical MEMS structure 14 that comprises a free-standing structure/mechanical element 16—such as a beam—with the free-standing structure 16 having a cantilevered portion 18 that extends over contact 12, and with an underside or bottom surface 17 of the free-standing structure 16 being covered, in an exemplary embodiment, by a seed layer 20 that is mechanically coupled to and electrically connected with the structure, as will be discussed in greater detail below. The free-standing structure 16 is supported by an anchor portion 22, from which the cantilevered portion 18 extends, and which may be integrated with the free-standing structure 16. The anchor portion 22 serves to connect the cantilevered portion 18 of the free-standing structure 16 to an underlying support structure, such as a conductive mount 21 formed on a substrate 24. The substrate 24 may be formed of any of a number of materials suitable for MEMS device fabrication, including silicon and silicon-based substrates (e.g., silicon carbide (SiC)), fused silica or glass, for example.

As shown in FIGS. 2 and 3, the free-standing structure 16 can be configured to be selectively moveable between a first, non-contacting, off, or open position or state, shown in FIG. 2, in which the free-standing structure 16 (and seed layer 20) is separated from the contact 12 by a separation distance d, and a second, contacting, on, or closed position or state, shown in FIG. 3, in which the free-standing structure 16 (and seed layer 20) comes into electrical contact with the contact 12. As shown, seed layer 20 acts as the electrical contact for free-standing structure 16. As such, seed layer 20 electrically couples free-standing structure 16 and contact 12 when seed layer 20 comes into mechanical contact and electrical communication with electrical contact 12. Further, the free-standing structure 16 and seed layer 20 can be configured to undergo deformation when moving between the contacting and non-contacting positions, such that the free-standing structure 16 and seed layer 20 are naturally disposed (i.e., in the absence of externally applied forces) in the non-contacting position and may be deformed so as to occupy the contacting position while storing mechanical energy therein. In other embodiments, the undeformed configuration of the free-standing structure 16 and seed layer 20 may be the contacting position.

Referring again to FIG. 1, the MEMS switch 10 may also include an electrode 26 which, when appropriately charged, provides a potential difference between the electrode 26 and the free-standing structure 16 and seed layer 20, resulting in an electrostatic force that pulls the free-standing structure 16 and seed layer 20 toward the electrode 26 and against the contact 12. With application of sufficient voltage to the electrode 26, the electrostatic force deforms the free-standing structure 16 and seed layer 20 and thereby displaces the free-standing structure 16 and seed layer 20 from the non-contacting (i.e., open or non-conducting) position shown in FIG. 2 to the contacting (i.e., closed or conducting) position shown in FIG. 3. Therefore, the electrode 26 may act as a "gate" with respect to the MEMS switch 10, with voltages (referred to as "gate voltages") applied to the electrode 26 serving to control the opening or closing of the MEMS structure 14. The electrode 26 may be in communication with a gate voltage source 28, so that a gate voltage $V_G$ may be selectively applied to the electrode 26.

The contact 12, free-standing structure 16, and seed layer 20 are components of a circuit 30. An exemplary circuit 30 has a first side 32 and a second side 34 that, when disconnected from one another, are at different electric potentials relative to one another (as where only one of the sides is connected to a power source 36). The contact 12 and free-standing structure 16, by way of seed layer 20, can be respectively connected to either of the sides 32, 34 of the circuit 30, such that deformation of the free-standing structure 16 and seed layer 20 between the first and second positions acts to respectively pass and interrupt a current therethrough. The free-standing structure 16 and seed layer 20 may be repeatedly moved into and out of contact with the contact 12 at a frequency (either uniform or non-uniform) that is determined by the application for which the MEMS structure 14 is utilized. When the contact 12 and the bottom surface 17 of free-standing structure 16 that includes the seed layer 20 are separated from one another, the voltage difference between the contact 12 and free-standing structure 16 is referred to as the "stand-off voltage."

In one embodiment, the free-standing structure 16 and seed layer 20 may be in communication (e.g., via the anchor structure 22) with the power source 36, and the contact 12 may be in communication with an electrical load 38 having a load resistance $R_L$. The power source 36 may be operated as a voltage source or a current source. The free-standing structure 16 and seed layer 20 act as an electrical contact (i.e., ohmic contact), allowing a load current to flow from the power source 36 through the free-standing structure 16 and seed layer 20, into the contact 12 and to the electrical load 38 when the free-standing structure 16 and seed layer 20 are in the contacting position, and otherwise disrupting or interrupting the electrical path and preventing the flow of current from the power source to the load when the free-standing structure 16 and seed layer 20 are in the non-contacting position.

The above-described MEMS structure 14 could be utilized as part of an electrical or power system or circuit including other switch structures, whether similar or dissimilar in design, in order to increase the current and voltage capacity of the overall circuit. Such switch structures could be configured in series or in parallel to facilitate an even distribution of stand-off voltage when the switch structures are open and an even distribution of current when the switch structures are closed.

Figure 4:
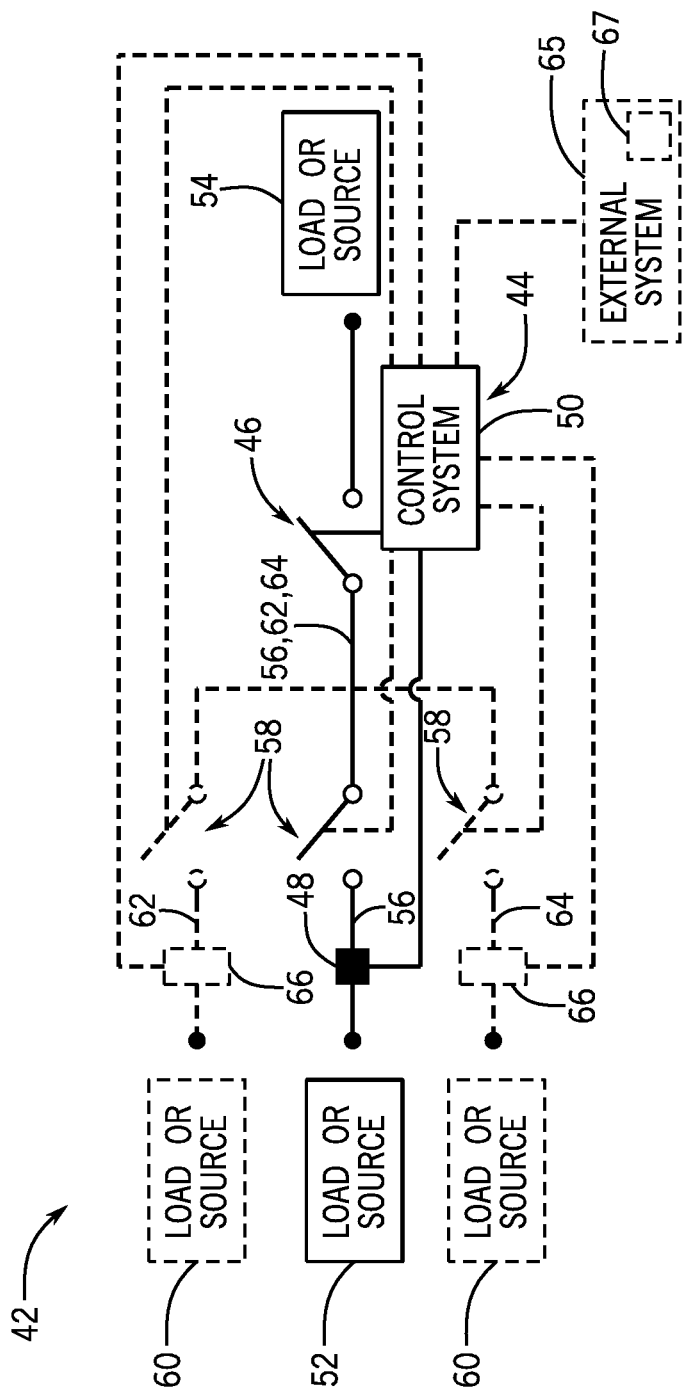
FIG. 4 is a schematic of a power system incorporating a fault interruption MEMS switch module, according to an embodiment of the invention.

Referring now to FIG. 4, a schematic of an electrical or power system or circuit 42 incorporating a fault or failure interruption or isolation MEMS switch module or unit 44 is shown, according to an embodiment of the invention. Fault interruption MEMS switch module 44 protects power system 42 during a fault condition or failure mode by interrupting current flowing through power system 42 and isolating each electrical load from each power source. MEMS switch module 44 includes a fault or failure isolation or interruption MEMS switch 46, a fault or failure sensor 48, and a control system or unit 50 that controls fault interruption MEMS switch 46 based on a measured or sensed circuit or system characteristic or variable received from fault sensor 48. Power system 42 further includes a power source or system, circuit or electrical load 52 and a power source or system, circuit, or electrical load 54 along an electrical, current, or circuit path 56. Electrical path 56 electrically connects or couples source or load 52 to source or load 54 through fault interruption MEMS switch 46 and an operation or process MEMS switch 58.

Power system 42 may also include optional power sources, circuits, or electrical loads 60. While only two optional sources or loads 60 are shown, power system 42 should not be limited to four sources or loads 52, 54, 60 and may include additional sources or loads as needed. If power system 42 includes optional sources or loads 60, optional sources or loads 60 are electrically connected or coupled to source or load 54 through fault interruption MEMS switch 46 and additional operation or process MEMS switches 58 along electrical current, or circuit paths 62, 64. In some embodiments, control system 50 controls process MEMS switches 58 according to the normal operation of power system 42. In other embodiments, another control system or unit (not shown) controls process MEMS switches 58 according to the normal operation of power system 42. Fault interruption MEMS switch module 44 may further include optional fault or failure sensors 66 along circuit paths 62, 64 in communication with control system 50.

While reference numbers 52 and 54 indicate a source or a load, one of source or load 52 and source or load 54 will be a source, and one of source or load 52 and source or load 54 will be a load. For example, in one embodiment, source or load 52 is a power source, and source or load 54 is an electrical load. In another embodiment, source or load 54 is a power source, and source or load 52 is an electrical load. Also, if optional sources or loads 60 are included in power system 42, sources or loads 60 will follow source or load 52 so that if source or load 52 is a source, then sources or loads 60 are sources and if source or load 52 is a load, sources or loads 60 are loads. For example, in one embodiment, source or load 52 and sources or loads 60 are power sources, and source or load 54 is an electrical load. In another embodiment, source or load 54 is a power source, and source or load 52 and sources or loads 60 are electrical loads. In any case, each current path 56, 62, 64 runs through fault interruption MEMS switch 46. In addition, process MEMS switches 58 may be implemented as individual switches or as a switch array.

Fault interruption MEMS switch 46 and process MEMS switches 58 may each be in the form of an electrostatic MEMS switch such as, for example, MEMS switch 10 of FIG. 1. In addition, each MEMS switch 46, 58 is operable in an open or off state or position that prevents or disables current from flowing therethrough and a closed or on state or position that allows or enables current to flow therethrough. Example open and closed positions of MEMS switches are shown in FIGS. 2 and 3, respectively. Further, if the fault interruption MEMS switch 46 is of the same construction as process MEMS switches 58, fault interruption MEMS switch 46 and any corresponding interconnectivity circuitry may be built in parallel on the same monolithic substrate as process MEMS switches 58 so that fault interruption MEMS switch 46 and process MEMS switches are part of the same switch architecture, and the additional fault interruption MEMS switch 46 adds little to no cost to the construction of power system 42.

As described above, MEMS switch module 44 operates to protect power system 42 upon occurrence of a fault or failure that may cause damage to or at least affect the performance of power system 42. Upon system power up, control system 50 switches fault interruption MEMS switch 46 from the open position to the closed position to enable source or load 52 to electrically couple or connect to source or load 54. If fault interruption MEMS switch 46 is in the form of electrostatic MEMS switch 10 of FIG. 1, control system 50 closes MEMS switch 46 by applying sufficient gate voltage to electrode 26 to pull free-standing structure 16 against contact 12 as shown in FIG. 3. Fault sensor 48 and, if included in MEMS switch module 44, each optional fault sensor 66 measures or senses one or more system or circuit characteristics or variables.

While fault sensors 48, 66 are shown in FIG. 4 as current sensors in current paths 56, 62, 64, fault sensors 48, 66 should not be limited to current sensors, current paths 56, 62, 64, or to the number of fault sensors 48, 66 shown. Fault sensors 48, 66 may be used to detect any type of variable useful for determining whether a fault condition has occurred in power system 42, such as, for example, a voltage, a current, a logic state, and a temperature. Each fault sensor 48, 66 may be used to measure a different type of variable or may be used in conjunction with the other fault sensors 48, 66. In any case, fault sensors 48, 66 then communicate their measurements to control system 50.

Control system 50 then analyzes or monitors the measured variable(s) to determine or detect if there is an existing fault condition that is affecting or could affect power system 42. One type of fault condition for which control system 50 monitors is the stuck closed condition, during which process MEMS switches 58 are unable to open for reasons described previously. In that case, control system 50 may monitor the current in current paths 56, 62, 64 to detect whether process MEMS switches 58 are closed when they should be open. However, control system 50 may also analyze the additional/alternative variable(s) set forth above for other fault conditions such as, for example, short circuits, open circuits, voltage transients or power surges or spikes, power failure, power sags, brownouts or undervoltage conditions, overvoltage conditions, electrical line noise, frequency variations, switching transients, harmonic distortion, and cooling system failures. Control system 50 may use any number of measurements either within or outside of power system 42 to monitor for any of the above-mentioned fault conditions, with FIG. 4 illustrating that power system 42 may be connected to an external system 65 that may have one or more optional fault sensors 67 for measuring one or more variables associated with any of the above-described fault conditions. For example, power system 42 may be connected to an external cooling system 65 having a fault sensor 67 for sensing a variable indicating whether external cooling system has failed.

If control system 50 determines that no fault condition exists, control system 50 continues to keep fault interruption MEMS switch 46 in the closed position. However, if control system 50 detects a fault condition, control system 50 switches fault interruption MEMS switch 46 from the closed position to the open position to disable source or load 52 from electrically coupling or connecting to source or load 54. For example, if one or more process MEMS switches 58 are stuck in the closed position, control system 50 will detect a stuck closed condition and open fault interruption MEMS switch 46. If fault interruption MEMS switch 46 is in the form of electrostatic MEMS switch 10 of FIG. 1, control system 50 opens MEMS switch 46 by ceasing the application of gate voltage to electrode 26 so that free-standing structure 16 separates from contact 12 as shown in FIG. 2.

When fault interruption MEMS switch 46 is in the open position, current may not flow between source or load 52 and source or load 54 regardless of the position of process MEMS switches 58. This is because each current path 56, 62, 64 may only be complete if fault interruption MEMS switch 46 is in the closed position. Hence, switching fault interruption MEMS switch 46 from the closed position to the open position interrupts power system 42 and isolates source or load 54 from sources or loads 52, 60. The isolation provided by fault interruption MEMS switch 46 prevents power system 42 from incurring any more damage because of a fault condition. Further, because fault interruption MEMS switch 46 likely only has to be opened once, the reliability of the fault interruption MEMS switch 46 will far exceed that of process MEMS switches 58. This increased reliability of MEMS switch 46 benefits power system 42 in that process MEMS switches 58 are operating in a hot switching condition that will degrade their reliability much more quickly than a cold switching condition.

While it is recognized that a fuse or a transistor may be used in place of fault interruption MEMS switch 46, fault interruption MEMS switch 46 provides significant advantages over either a fuse or a transistor. Both a fuse and a transistor would be less cost effective than fault interruption MEMS switch 46 because, as described above, fault isolation MEMS switch 46 and any corresponding interconnectivity circuitry can be fabricated in parallel with process MEMS switches 58 on the same monolithic substrate. In a system needing fault interruption in many places (e.g., a system that includes tens, hundreds, or thousands of process MEMS switches), fault interruption MEMS switch 46 would save on cost significantly. Also, a fuse would require a manual reset as opposed to a system reset that could be performed on fault interruption MEMS switch 46. Furthermore, a fuse would work much more slowly than fault interruption MEMS switch 46. In addition, being a mechanical relay, fault interruption MEMS switch 46 provides more isolation than a transistor that can experience leakage.

Figure 5:
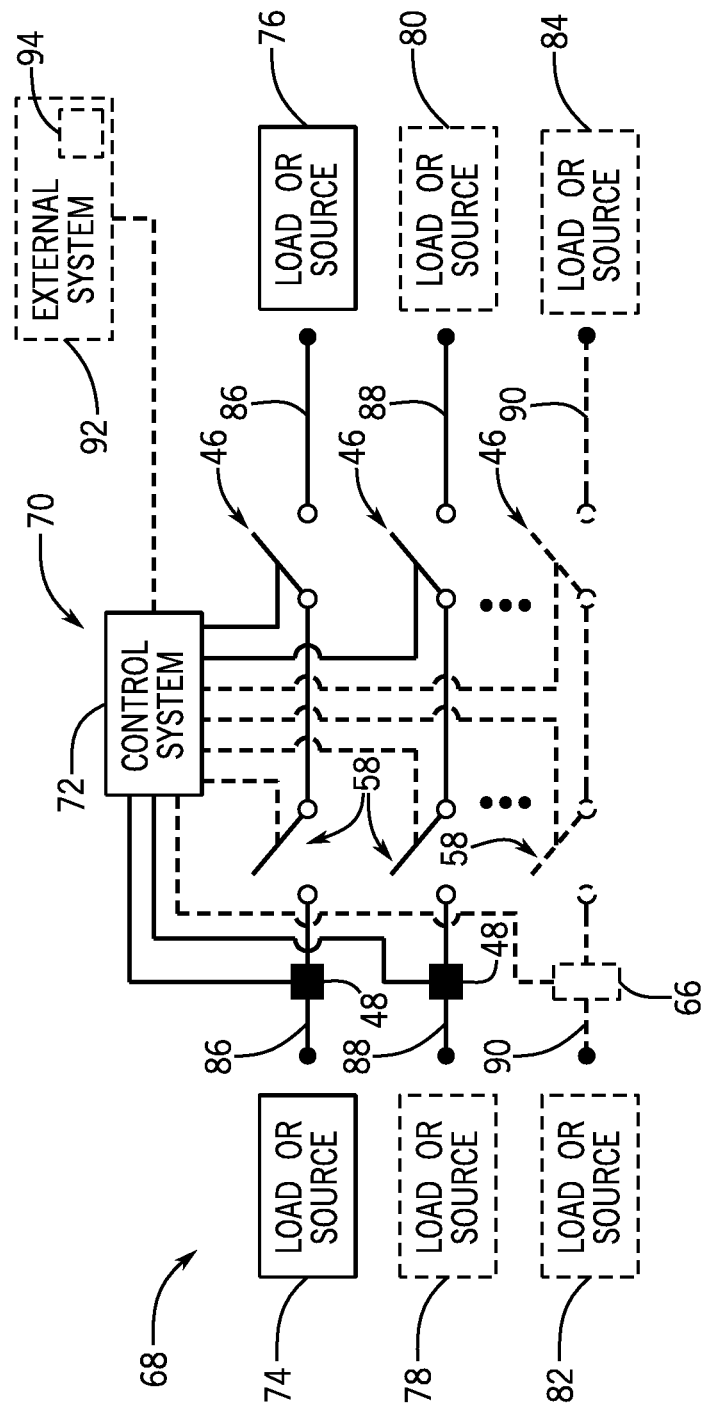
FIG. 5 is a schematic of a power system incorporating a fault interruption MEMS switch module, according to another embodiment of the invention.

Referring now to FIG. 5, a schematic of an electrical or power system or circuit 68 incorporating a fault or failure interruption or isolation MEMS switch module or unit 70 is shown, according to another embodiment of the invention. Power system 68 includes a number of components similar to components of power system 42 of FIG. 4, and thus numbers used to indicate components in FIG. 4 will also be used to indicate similar components in FIG. 5. Fault interruption MEMS switch module 72 protects power system 68 during a fault condition or failure mode by interrupting current flowing through power system 68 and isolating each electrical load from each power source. Fault interruption MEMS switch module 70 includes fault or failure isolation or interruption MEMS switches 46, fault or failure sensors 48, and a control system or unit 72 that controls fault interruption MEMS switches 46 based on measured or sensed circuit or system characteristics or variables received from fault sensors 48. Power system 68 further includes a power source or system, circuit, or electrical load 74 and a power source or system, circuit, or electrical load 76. Power system 68 may also include optional power sources, circuits, or electrical loads 78, 80, 82, 84. While only four optional sources or loads 78, 80, 82, 84 are shown, power system 68 should not be limited to six sources or loads 74, 76, 78, 80, 82, 84 and may include additional sources or loads as needed.

As with sources or loads 52, 54, 60 of FIG. 4, sources or loads 74, 76, 78, 80, 82, 84 are configured so that sources are only electrically connected to loads and loads are only electrically connected to sources. Sources or loads 74, 76, 78, 80, 82, 84 may be electrically connected or coupled to each other in a number of ways along electrical, current, or circuit paths 86, 88 and optional electrical, current, or circuit path 90. However, while only one option electrical path 90 is shown, power system 68 should not be limited to one optional electrical path 90 and may include additional electrical paths as needed.

Sources or loads 74, 78, 82 may be electrically coupled to one or all of sources or loads 76, 80, 84 along distinct, parallel, or independent electrical paths 86, 88, 90 in any conceivable combination. For example, in one embodiment, power system 68 includes only sources or loads 74, 76, which are electrically coupled to each other via electrical paths 86, 88 or electrical paths 86, 88, 90 in a multi-phase power system. In another embodiment, power system 68 includes only sources or loads 74, 76, 78, 82 so that sources or loads 74, 78, 82 are electrically coupled to source or load 76 via electrical paths 86, 88. In still another example, power system 68 includes only sources or loads 74, 76, 78, 80, 82, 84 so that source or load 74 is electrically coupled to source or load 76 via electrical path 86, source or load 78 is electrically coupled to source or load 80 via electrical path 88, and source or load 80 is electrically coupled to source or load 82 via electrical path 90. The above examples are not meant to be an exhaustive list of embodiments of power system 68, but are only described for the purpose of illustrating potential electrical connections between sources or loads 74, 76, 78, 80, 82, 84.

In any case, each parallel electrical path 86, 88, 90 includes a process MEMS switch 58 and a fault interruption MEMS switch 46. In some embodiments, control system 72 controls process MEMS switches 58 according to the normal operation of power system 68. In other embodiments, another control system or unit (not shown) controls process MEMS switches 58 according to the normal operation of power system 68. If power system 68 includes optional electrical path 90, MEMS switch module 70 may include optional fault sensor 66. As described with respect to power system 42 of FIG. 4, fault interruption MEMS switch 46 and process MEMS switches 58 may each be in the form of an electrostatic MEMS switch such as, for example, MEMS switch 10 of FIG. 1, and are operable in the open or closed positions such as, for example, the open and closed positions shown in FIGS. 2 and 3, respectively. In addition, as described with respect to power system 42 of FIG. 4, if the fault interruption MEMS switch 46 is of the same construction as process MEMS switches 58, fault interruption MEMS switch 46 may be built in parallel on the same monolithic substrate as process MEMS switches 58. Then fault interruption MEMS switch 46 and process MEMS switches are part of the same switch architecture, and the additional fault interruption MEMS switch 46 adds little to no cost to the construction of power system 68.

As explained above, MEMS switch module 70 operates to prevent power system 68 from continuing to experience damage from a fault or failure that has occurred. When power system 68 powers up, control system 72 switches fault interruption MEMS switches 46 from the open position to the closed position to enable source or load 74 to electrically couple to source or load 76. If fault interruption MEMS switches 46 are in the form of electrostatic MEMS switch 10 of FIG. 1, control system 72 applies sufficient gate voltage to electrodes 26 of fault isolation MEMS switches 46 to pull free-standing structures 16 against contacts 12 as shown in FIG. 3. Fault sensors 48 and, if included in MEMS switch module 72, each optional fault sensor 66 measure or sense one or more system or circuit characteristics or variables.

While fault sensors 48, 66 are shown in FIG. 5 as current sensors in current paths 86, 88, 90, respectively, fault sensors 48, 66 should not be limited to current sensors, current paths 86, 88, 90, or to the number of fault sensors 48, 66 shown. Fault sensors 48, 66 may be used to detect any type of variable useful for determining whether a fault condition has occurred such as, for example, a voltage, a current, a logic state, and a temperature. Each fault sensor 48, 66 may be used to measure a different type of variable or may be used in conjunction with the other fault sensors 48, 66. In any case, fault sensors 48, 66 then communicate their measurements to control system 72.

Control system 72 then analyzes or monitors the measured characteristics to determine or detect if there is an existing fault condition that is affecting or could affect power system 68. One type of fault condition for which control system 50 monitors is the stuck closed condition, during which process MEMS switches 58 are unable to open for reasons described previously. In that case, control system 72 may monitor the current in current paths 86, 88, 90 to detect whether process MEMS switches 58 are closed when they should be open. However, control system 72 may also analyze the characteristics for other fault conditions such as, for example, short circuits, open circuits, voltage transients or power surges or spikes, power failure, power sags, brownouts or undervoltage conditions, overvoltage conditions, electrical line noise, frequency variations, switching transients, harmonic distortion, and cooling system failures. Control system 72 may detect any of the above fault conditions using any number of measurements taken within or outside of power system 68. Power system 68 may be connected to an external system 92 that may have one or more optional fault sensors 94 for measuring one or more variables associated with any of the above-described fault conditions. For example, power system 68 may be connected to an external cooling system 92 having a fault sensor 94 for sensing a variable indicating whether external cooling system has failed.

If control system 72 does not detect a fault condition, control system 72 keeps fault interruption MEMS switches 46 in the closed position. However, if control system 72 determines a fault condition has occurred, control system 72 switches all fault interruption MEMS switches 46 from the closed position to the open position to disable source or load 74 from electrically coupling to source or load 76. For example, if one or more process MEMS switches 58 are stuck in the closed position, control system 72 will detect a stuck closed condition and open each fault interruption MEMS switch 46. If fault interruption MEMS switches 46 are in the form of electrostatic MEMS switch 10 of FIG. 1, control system 72 opens MEMS switches 46 by ceasing the application of gate voltage to electrodes 26 so that freestanding structures 16 separate from contacts 12 as shown in FIG. 2.

When control system 72 opens fault interruption MEMS switch 46, current is prevented from flowing between source or load 74 and source or load 76, even if process MEMS switches are in the closed position. This is because each current path 86, 88, 90 is only complete if fault interruption MEMS switch 46 is closed. Therefore, opening fault interruption MEMS switch 46 interrupts power system 68 and isolates source or load 74 from source or load 76. That isolation stops power system 68 from sustaining any more damage during a fault condition. Also, because fault interruption MEMS switch 46 probably only has to be opened once, fault interruption MEMS switch 46 has much greater reliability than process MEMS switches 58. This increased reliability of MEMS switch 46 benefits power system 68 since process MEMS switches 58 operate in a hot switching condition that degrades their reliability much quicker than a cold switching condition.

Beneficially, embodiments of the invention thus provide a power system including a fault interruption MEMS switch module. The MEMS switch module includes a fault interruption MEMS switch operated by a control system based on feedback from at least one fault sensor. The control system closes the fault interruption MEMS switch upon system power up and opens the fault interruption MEMS switch upon detection of a fault condition, such as, for example, a stuck closed condition in a process MEMS switch in the power system. When the fault interruption MEMS switch is in the open position, no current may flow therethrough, and an electrical load in the power system is isolated from a power source. The fault interruption MEMS switch and any corresponding interconnectivity circuitry may be built in the same MEMS switch architecture as other process MEMS switches in the power system, thus providing a low cost solution to interrupt a fault condition in the power system as compared to fuses and transistors, for example. The fault interruption MEMS switch provides additional advantages over fuses and transistors because it is fast-acting, does not require a manual reset, and provides for physical isolation of the electrical load, not just electrical isolation.

According to one embodiment of the invention, an electrical system having a fault interruption MEMS switch unit comprises a first operation MEMS switch positioned in a first electrical path, the first operation MEMS switch operable in an on state that enables current to flow to a first electrical load and an off state that disables current from flowing to the first electrical load. The electrical system also includes a first fault interruption MEMS switch positioned in series with the first operation MEMS switch, the first fault interruption MEMS switch operable in an on state that enables current to flow to the first electrical load and an off state that disables current from flowing to the first electrical load, wherein operation of the first fault interruption MEMS switch in the off state disables current from flowing to the first electrical load regardless of the state of the first operation MEMS switch. The electrical system further includes a first fault sensor positioned to sense a first system variable and a control system programmed to receive the first system variable from the first fault sensor, analyze the first system variable to detect if a fault is affecting the electrical system and, upon detection of a fault, switch the first fault interruption MEMS switch from the on state to the off state to interrupt current flowing through the first operation MEMS switch to the first electrical load.

According to another embodiment of the invention, a method of interrupting current in an electrical circuit upon detection of a fault condition includes receiving power at an input to the electrical circuit and closing a first fault isolation MEMS switch via a controller upon powering up the electrical circuit so as to allow current to flow from the input to a first circuit load, the first fault isolation MEMS switch positioned in a first current path. The method also includes selectively operating a first operation MEMS switch in series with the first fault isolation MEMS switch to provide current to the first circuit load through the first current path and interrupt current through the first current path, measuring, via a first fault sensor, a first characteristic affecting the electrical circuit, and providing the measured first characteristic to the controller. The method further includes monitoring, via the controller, the measured first characteristic to detect if a fault condition is present and opening, via the controller, the first fault isolation MEMS switch upon detecting that a fault condition is present so as to interrupt current flowing to the first electrical load and prevent damage to the electrical circuit.

According to yet another embodiment of the invention, a power system having MEMS switch failure protection includes a power source, a first system load that receives power from the power source, and a first process MEMS switch disposed between the power source and the first system load along a first circuit path, the first process MEMS switch operable in a closed position and an open position to selectively control a current flowing from the power source to the first system load. The power system also includes a failure isolation MEMS switch module having a first failure isolation MEMS switch positioned in series with the first process MEMS switch and operable in a closed position and an open position to selectively control a current flowing through the first process MEMS switch, a first failure sensor measuring a first system characteristic corresponding to the position of the first process MEMS switch, and a control unit programmed to receive the first system characteristic from the first failure sensor, determine, using the first system characteristic, if the first process MEMS switch is stuck in the closed position and, upon determining that the first process MEMS switch is stuck in the closed position, switch the first failure isolation MEMS switch from the closed position to the open position to electrically isolate the first system load from the power source.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electrical system having a fault interruption micro-electro-mechanical system (MEMS) switch unit, the electrical system comprising:
    a first operation MEMS switch positioned in a first electrical path, the first operation MEMS switch operable in an on state that enables current to flow to a first electrical load and an off state that disables current from flowing to the first electrical load;
    a first fault interruption MEMS switch positioned in series with and controlled independently from the first operation MEMS switch, the first fault interruption MEMS switch operable in an on state that enables current to flow to the first electrical load and an off state that disables current from flowing to the first electrical load, wherein operation of the first fault interruption MEMS switch in the off state disables current from flowing to the first electrical load regardless of the state of the first operation MEMS switch;
    a first fault sensor positioned to sense a first system variable; and
    a control system programmed to:
        receive the first system variable from the first fault sensor;
        analyze the first system variable to detect if a fault is affecting the electrical system; and
        upon detection of a fault, switch the first fault interruption MEMS switch from the on state to the off state to interrupt current flowing through the first operation MEMS switch to the first electrical load.

2. The electrical system of claim 1 further comprising a second fault sensor positioned to sense a second system variable; and
    wherein the control system is further programmed to:
        receive the second system variable from the second fault sensor;
        analyze the second system variable to detect if a fault is affecting the electrical system; and
        upon detection of a fault based on the analysis of any of the first and second system variables, switch the first fault interruption MEMS switch from the on state to the off state to interrupt current flowing through the first operation MEMS switch to the first electrical load.

3. The electrical system of claim 1 further comprising a second operation MEMS switch positioned in a second electrical path and in series with the first fault interruption MEMS switch, the second operation MEMS switch operable in an on state that enables current to flow to the first electrical load and an off state that disables current from flowing to the first electrical load; and
wherein, when the first fault interruption MEMS switch is in the off state, current is disabled from flowing to the first electrical load regardless of the state of the second operation MEMS switch.

4. The electrical system of claim 1 further comprising:
a second operation MEMS switch positioned in a second electrical path distinct from the first electrical path, the second operation MEMS switch operable in an on state that enables current to flow to the first electrical load and an off state that disables current from flowing to the first electrical load; and
a second fault interruption MEMS switch positioned in series with the second operation MEMS switch, the second fault interruption MEMS switch comprising an on state that enables current to flow to the first electrical load and an off state that disables current from flowing to the first electrical load regardless of the state of the second operation MEMS switch; and
wherein the control system is further programmed to, upon detection of a fault, switch the second fault interruption MEMS switch from the on state to the off state to interrupt current flowing through the second operation MEMS switch to the first electrical load.

5. The electrical system of claim 1 further comprising a second operation MEMS switch positioned in a second electrical path parallel to the first electrical path, the second operation MEMS switch operable in an on state that enables current to flow to a second electrical load and an off state that disables current from flowing to the second electrical load;
further comprising a second fault interruption MEMS switch positioned in series with the second operation MEMS switch, the second fault interruption MEMS switch comprising an on state that enables current to flow to the second electrical load and an off state that disables current from flowing to the second electrical load regardless of the state of the second operation MEMS switch; and
wherein the control system is further programmed to, upon detection of a fault, switch the second fault interruption MEMS switch from the on state to the off state to interrupt current flowing through the second operation MEMS switch to the second electrical load.

6. The electrical system of claim 1 wherein the control system is further programmed to selectively operate the first operation MEMS switch in the on state and the off state.

7. The electrical system of claim 1 wherein the control system is programmed to:
analyze the first system variable to determine if the first operation MEMS switch is stuck in the on state; and
upon determining that the first operation MEMS switch is stuck in the on state, switch the first fault interruption MEMS switch from the on state to the off state.

8. The electrical system of claim 1 wherein the control system is further programmed to operate the first fault interruption MEMS switch in the on state upon start up of the electrical system.

9. The electrical system of claim 1 wherein the control system is programmed to analyze the first system variable to detect if one of a short circuit, an open circuit, a power surge, a power failure, a power sag, an undervoltage condition, an overvoltage condition, electrical line noise, frequency variations, switching transients, harmonic distortion, and a cooling system failure is affecting the electrical system.

10. The electrical system of claim 1 wherein the operation MEMS switch and the fault interruption MEMS switch are built in parallel on one monolithic substrate, along with any interconnectivity circuitry between the MEMS switch and the fault interruption MEMS switch.

11. A method of interrupting current in an electrical circuit upon detection of a fault condition, the method comprising:
receiving power at an input to the electrical circuit;
closing a first fault isolation MEMS switch via a controller upon powering up the electrical circuit so as to allow current to flow from the input to a first circuit load, the first fault isolation MEMS switch positioned in a first current path;
selectively operating a first operation MEMS switch in series with the first fault isolation MEMS switch to provide current to the first circuit load through the first current path and interrupt current through the first current path while the first fault isolation MEMS switch remains closed;
measuring, via a first fault sensor, a first characteristic affecting the electrical circuit;
providing the measured first characteristic to the controller;
monitoring, via the controller, the measured first characteristic to detect if a fault condition is present; and
opening, via the controller, the first fault isolation MEMS switch upon detecting that a fault condition is present so as to interrupt current flowing to the first electrical load and prevent damage to the electrical circuit.

12. The method of claim 11 wherein monitoring the measured first characteristic to detect if a fault condition is present comprises determining whether the measured first operational characteristic indicates that the first operation MEMS switch is stuck in a closed position.

13. The method of claim 11 further comprising:
closing a second fault isolation MEMS switch via the controller upon powering up the electrical circuit so as to allow current to flow from the input to the first circuit load, the second fault isolation MEMS switch positioned in a second current path parallel to the first current path;
selectively operating a second operation MEMS switch in series with the second fault isolation MEMS switch to provide current to the first circuit load through the second current path and interrupt current through the second current path; and
opening, via the controller, the second fault isolation MEMS switch upon detecting that a fault condition is present so as to interrupt current flowing to the first electrical load and prevent damage to the electrical circuit.

14. The method of claim 11 further comprising:
closing a second fault isolation MEMS switch via the controller upon powering up the electrical circuit so as to allow current to flow from the input to a second circuit load;
selectively operating a second operation MEMS switch in series with the second fault isolation MEMS switch to provide current to the second circuit load; and opening, via the controller, the second fault isolation MEMS switch upon detecting that a fault condition is present so as to interrupt current flowing to the second circuit load and prevent damage to the electrical circuit.

15. The method of claim 11 further comprising:
measuring, via a second fault sensor, a second characteristic affecting the electrical circuit;
providing the measured second characteristic to the controller; and
monitoring, via the controller, the measured second characteristic to detect if a fault condition is present.

16. The method of claim 11 wherein closing the first fault isolation MEMS switch comprises applying a gate voltage to an electrode sufficient to pull a free standing structure electrically coupled to the input against a contact electrically coupled to the first electrical load; and
wherein opening the first fault isolation MEMS switch comprises removing the gate voltage from the electrode such that the free standing structure moves away from the contact.

17. A power system having micro-electro-mechanical system (MEMS) switch failure protection, the power system comprising:
a power source;
a first system load that receives power from the power source;
a first process MEMS switch disposed between the power source and the first system load along a first circuit path, the first process MEMS switch operable in a closed position and an open position to selectively control a current flowing from the power source to the first system load; and
a failure isolation MEMS switch module comprising:
a first failure isolation MEMS switch positioned in series with the first process MEMS switch, the first failure isolation MEMS switch operable in a closed position and an open position to selectively control a current flowing through the first process MEMS switch;
a first failure sensor measuring a first system characteristic corresponding to the position of the first process MEMS switch; and
a control unit programmed to:
receive the first system characteristic from the first failure sensor;
determine, using the first system characteristic, if the first process MEMS switch is stuck in the closed position; and
upon determining that the first process MEMS switch is stuck in the closed position, switch the first failure isolation MEMS switch from the closed position to the open position to electrically isolate the first system load from the power source.

18. The power system of claim 17 further comprising a second process MEMS switch disposed between the power source and the first system load along a second circuit path, the second process MEMS switch operable in a closed and an open position to selectively control a current flowing from the power source to the first system load;
wherein the first failure isolation MEMS switch is positioned in series with the second process MEMS switch, the first failure isolation MEMS switch operable to selectively control a current flowing through the second process MEMS switch;
wherein the failure isolation MEMS switch module further comprises a second failure sensor measuring a second system characteristic corresponding to the position of the second process MEMS switch; and
wherein the control unit is further programmed to:
receive the second system characteristic from the fault sensing circuit;
determine, using the second system characteristic, if the second process MEMS switch is stuck in the closed position; and
upon determining that at least one of the first process MEMS switch and the second process MEMS switch is stuck in the closed position, switch the first failure isolation MEMS switch from the closed position to the open position to electrically isolate the first system load from the power source.

19. The power system of claim 17 further comprising a second process MEMS switch disposed between the power source and a second system load along a second circuit path independent from the first circuit path, the second process MEMS switch operable in a closed and an open position to selectively control a current flowing from the power source to the second system load;
wherein the failure isolation MEMS switch module further comprises:
a second failure isolation MEMS switch positioned in series with the second process MEMS switch, the second failure isolation MEMS switch operable in a closed and an open position to selectively control a current flowing through the second process MEMS switch;
a second failure sensor measuring a second circuit characteristic corresponding to the position of the second process MEMS switch; and
wherein the control unit is further programmed to:
receive the second system characteristic from the second failure sensor;
determine, using the second system characteristic, if the second process MEMS switch is stuck in the closed position; and
upon determining that at least one of the first process MEMS switch and the second process MEMS switch is stuck in the closed position, switch the first and second failure isolation MEMS switches from the closed position to the open position to electrically isolate the first system load and the second system load from the power source.

20. The power system of claim 17 further comprising a second process MEMS switch disposed between the power source and the first system load along a second circuit path distinct from the first circuit path, the second process MEMS switch operable in a closed and an open position to selectively control a current flowing from the power source to the first system load;
wherein the failure isolation MEMS switch module further comprises:
a second failure isolation MEMS switch positioned in series with the second process MEMS switch, the second failure isolation MEMS switch operable in a closed and an open position to selectively control a current flowing through the second process MEMS switch;
a second failure sensor measuring a second circuit characteristic corresponding to the position of the second process MEMS switch; and
wherein the control unit is further programmed to:
receive the second system characteristic from the second failure sensor;

determine, using the second system characteristic, if the second process MEMS switch is stuck in the closed position; and upon determining that at least one of the first process MEMS switch and the second process MEMS switch is stuck in the closed position, switch the first and second failure isolation MEMS switches from the closed position to the open position to electrically isolate the first system load from the power source.

21. The power system of claim 17 wherein the first failure isolation MEMS switch comprises:

a contact positioned on a substrate and electrically coupled to the first system load;

a free-standing structure positioned on the substrate and electrically coupled to the power source; and an electrode positioned on the substrate such that, upon application of a gate voltage to the electrode, the electrode pulls the free-standing structure against the contact to switch the first failure isolation MEMS switch from the open position into the closed position.

* * * * *